US011330216B2

(12) United States Patent
Adusumalli et al.

(10) Patent No.: US 11,330,216 B2
(45) Date of Patent: May 10, 2022

(54) SENSOR ARRANGEMENT AND METHOD FOR DARK COUNT CANCELLATION

(71) Applicant: ams AG, Premstaetten (AT)

(72) Inventors: Ravi Kumar Adusumalli, Eindhoven (NL); Sudhakar Singamala, Eindhoven (NL)

(73) Assignee: AMS AG, Premstaetten (AT)

( * ) Notice: Subject to any disclaimer, the term of this patent is extended or adjusted under 35 U.S.C. 154(b) by 0 days.

(21) Appl. No.: 17/415,324

(22) PCT Filed: Nov. 25, 2019

(86) PCT No.: PCT/EP2019/082481
§ 371 (c)(1),
(2) Date: Jun. 17, 2021

(87) PCT Pub. No.: WO2020/126336
PCT Pub. Date: Jun. 25, 2020

(65) Prior Publication Data
US 2022/0060649 A1 Feb. 24, 2022

Related U.S. Application Data

(60) Provisional application No. 62/783,651, filed on Dec. 21, 2018.

(51) Int. Cl.
*H04N 5/3745* (2011.01)
*H04N 5/369* (2011.01)
(Continued)

(52) U.S. Cl.
CPC ...... *H04N 5/37455* (2013.01); *H03M 1/0607* (2013.01); *H03M 1/52* (2013.01); *H04N 5/361* (2013.01); *H04N 5/36963* (2018.08)

(58) Field of Classification Search
None
See application file for complete search history.

(56) References Cited

U.S. PATENT DOCUMENTS 9,287,837 B2 * 3/2016 Lau .................. H03M 1/0663
2009/0079607 A1 3/2009 Denison et al.
(Continued)

FOREIGN PATENT DOCUMENTS

| EP | 0450951 A2 | 10/1991 |
| EP | 2355358 A1 | 8/2011 |
| EP | 3370340 A1 | 9/2018 |

OTHER PUBLICATIONS

Ben Johnson et al: IIA scalable CMOS 1-15 sensor array for neuronal recording and imaging 11, 2011 IEEE Sensors Proceedings . . . Li Meri Ck, Ireland. Oct. 28-31, 2011, IEEE, Piscataway, NJ, Oct. 28, 2011 (Oct. 28, 2011), pp. 924-927, P032093463, DOI: 10.1109/ICSENS.2011.6127268 ISBN: 978-1-4244-9290-9 abstract; figure 1.

*Primary Examiner* — Mark T Monk
(74) *Attorney, Agent, or Firm* — Tarolli, Sundheim, Covell & Tummino LLP (57) ABSTRACT

A sensor arrangement for light sensing for light-to-frequency conversion. The sensor arrangement includes a photodiode, an analog-to-digital converter (ADC) operable to perform a chopping technique in response to a first clock signal (CLK1), and convert a photocurrent (IPD) into a digital comparator output signal (LOUT). The ADC includes a sensor input coupled to the photodiode, an output for providing the digital comparator output signal (LOUT), an integrator including an integrator input coupled to the sensor input and operable to receive an integrator input signal, a first set of chopping switches coupled to a first amplifier, a second set of chopping switches electrically coupled to an output of the first amplifier and electrically coupled to input (Continued)

terminals of a second amplifier, and an integrator output providing an integrator output signal (OPOUT).

18 Claims, 6 Drawing Sheets

(51) Int. Cl.
*H03M 1/06* (2006.01)
*H04N 5/361* (2011.01)
*H03M 1/52* (2006.01)

(56) References Cited

U.S. PATENT DOCUMENTS

2010/0122904 A1  5/2010  Hassibi et al.
2016/0233840 A1  8/2016  Wang et al.

* cited by examiner

SENSOR ARRANGEMENT AND METHOD FOR DARK COUNT CANCELLATION

RELATED APPLICATIONS

The present invention is a U.S. National Stage under 35 USC 371 patent application, claiming priority to Serial No. PCT/EP2019/082481, filed on 25 Nov. 2019; which claims priority of U.S. Provisional Application Ser. No. 62/783, 651, filed on 21 Dec. 2018, the entirety of both of which are incorporated herein by reference.

BACKGROUND

Modern consumer electronics (e.g., smartphones) make increasing use of many different sensors which are often included in the same device. In one particular application, ambient light sensors are used for display management where these sensors measure the ambient light brightness. Depending on the brightness of the ambient light, the display illumination can be adjusted, and power can be saved. If, for example, the ambient light is bright, a higher backlight illumination for display panel may be needed. If, however, the ambient light is less, a lower backlight illumination for display panel may be sufficient. By dynamically adjusting the display panel brightness, ambient light sensors help the display panel to optimize the operation power.

Some ambient light sensors include semiconductor junctions to generate a sensor signal to detect incident light. The light-to-electron conversion is typical for semiconductor junctions. Sometimes ambient light sensors use separate circuits for signal acquisition and processing. For example, ambient light sensors can use photodiodes and charge balancing analog-to-digital converters. Light sensors are placed under dark glass which requires a larger photodiode area to obtain the required sensitivity for a given electrical gain from the light sensor. A larger diode area means larger leakage current, with the result that the light sensor's sensitivity is limited for low light measurement.

SUMMARY

This specification describes technologies relating to optimizing cancellation of dark current in each ambient light sensor (ALS) measurement with one auto zero operation during initialization by utilizing chopping switches to measure low light accurately.

In general, one innovative aspect of the subject matter described in this specification can be embodied in a sensor arrangement for light sensing and temperature sensing including a photodiode, an analog-to-digital converter (ADC) operable to perform a chopping technique in response to a first clock signal (CLK1), and operable to convert a photocurrent (IPD) generated by the photodiode into a digital comparator output signal (LOUT), the ADC including a sensor input coupled to the photodiode, a result output for providing the digital comparator output signal (LOUT), an integrator including an integrator input coupled to the sensor input and operable to receive an integrator input signal, a first and a second amplifier, a first set of chopping switches electrically coupled to input terminals of the first amplifier, a second set of chopping switches electrically coupled to an output of the first amplifier and electrically coupled to input terminals of the second amplifier, and an integrator output providing an integrator output signal (OPOUT), and a signal processing unit coupled to the result output of the analog-to-digital converter and configured to determine from the digital comparator output signal (LOUT) a digital output signal (ADC-COUNT). Some implementations include one or more of the following features.

In some implementations, the ADC is operable to perform, prior to performing the chopping the technique, an initial phase including applying a coarse auto zero operation before a start of an integration time (T_INT) for an integration cycle, and applying a first reset/initialization phase that resets the ADC and signal acquisition is initialized at the start of the integration time (T_INT) for the integration cycle.

In some implementations, the ADC is operable to perform, subsequent to performing the initial phase, a first chopping technique including applying a first phase of chopping at the first set of chopping switches and the second set of chopping switches, where the first phase of chopping is applied at a first polarity, and applying, at a halfway timestamp and without stopping the integration cycle, a second phase of chopping at the first set of chopping switches and the second set of chopping switches, the halfway timestamp indicating a halfway point of the integration time (T_INT), where the second phase of chopping is applied at a second polarity, and where the second polarity is opposite of the first polarity.

In some implementations, the ADC is operable to perform, subsequent to performing the initial phase, a second chopping technique including applying, at a halfway timestamp, a first phase of chopping at the first set of chopping switches and the second set of chopping switches, the halfway timestamp indicating a halfway point of an integration time (T_INT) for the integration cycle, where the first phase of chopping is applied at a first polarity, applying a second reset/initialization phase that resets the ADC and signal acquisition is re-initialized at the halfway point of the integration time (T_INT) for the integration cycle, wherein the second reset/initialization phase stops the integration cycle and changes a polarity of the integrator output, and applying, after the second reset/initialization phase, a second phase of chopping at the first set of chopping switches and the second set of chopping switches, where the second phase of chopping is applied at the first polarity. In some implementations, changing the polarity of the integrator output from a first polarity to a second polarity includes switching the output of the first set of chopping switches for the input terminals of the first amplifier, and switching the output of the second set of chopping switches for the input terminals of the second amplifier.

In some implementations, the signal processing unit includes a first counter having a first clock input coupled to the result output and comprising a first reset input, a second counter comprising a second clock input and a second reset input, and a logic/calculation engine comprising a calculation input coupled to a first counter output of the first counter and a second counter output of the second counter, where the first counter is operable to receive the first clock signal (CLK1) at the first clock input and to generate the asynchronous count (C1) depending on the first clock signal (CLK1), the second counter is operable to receive the second clock signal (CLK2) at the second clock input and to generate the time count (C2) depending on the second clock signal (CLK2), and the logic/calculation engine is operable to receive the asynchronous count (C1) and the time count (C2) and to calculate the digital output signal (ADC-COUNT) from the asynchronous count (C1) and the time count (C2).

In some implementations, the sensor arrangement further includes a latched comparator operable receive the integrator output signal (OPOUT) and to provide the digital comparator output signal (LOUT). In some implementations, the sensor arrangement includes a digital control circuit operable to control each switch to switch between an open state and a closed state depending on a clock cycle. In some implementations, the digital output signal (ADC-COUNT) comprises an asynchronous count (C1) comprising an integer number of counts depending on the first clock signal (CLK1) and a fractional time count (C2) depending on a second clock signal (CLK2). In some implementations, the digital output signal (ADC-COUNT) is indicative of the photocurrent generated by the photodiode. In some implementations, the signal processing unit is configured to determine, based on the time count, an average integration period indicative of a modulation in the digital comparator output signal (LOUT).

In general, one innovative aspect of the subject matter described in this specification can be embodied in a method including generating, by an offset voltage across a photodiode, a photocurrent (IPD), converting, by an analog-to-digital converter (ADC), and based on a chopping technique performed during an integration cycle, the photocurrent (IPD) into a digital comparator output signal (LOUT) depending on a first clock signal (CLK1), wherein the ADC includes an integrator that includes a first set of chopping switches electrically coupled to input terminals of a first amplifier, a second set of chopping switches electrically coupled to an output of the first amplifier and electrically coupled to input terminals of a second amplifier, and an integrator output providing an integrator output signal (OPOUT). The method further includes determining, based on the digital comparator output signal (LOUT), an asynchronous count (C1) comprising an integer number of counts depending on the first clock signal (CLK1), determining, based on the digital comparator output signal (LOUT), a fractional time count (C2) depending on a second clock signal (CLK2), and calculating, based on the asynchronous count (C1) and the fractional time count (C2), a digital output signal (ADC-COUNT) which is indicative of the photocurrent generated by the photodiode.

Some implementations include one or more of the following features.

In some implementations, converting the photocurrent based on a chopping technique cancels the offset voltage across the photodiode.

In some implementations, the method further includes, prior to performing the chopping technique, performing an initial phase that includes applying a coarse auto zero operation before a start of an integration time (T_INT) for the integration cycle, and applying a first reset/initialization phase that resets the ADC and signal acquisition is initialized at the start of the integration time (T_INT) for the integration cycle.

In some implementations, subsequent to performing the initial phase, the chopping technique includes a first chopping technique including applying a first phase of chopping at the first set of chopping switches and the second set of chopping switches, where the first phase of chopping is applied at a first polarity, and applying, at a halfway timestamp and without stopping the integration cycle, a second phase of chopping at the first set of chopping switches and the second set of chopping switches, the halfway timestamp indicating a halfway point of the integration time (T_INT), where the second phase of chopping is applied at a second polarity, and where the second polarity is opposite of the first polarity.

In some implementations, subsequent to performing the initial phase, the chopping technique includes a second chopping technique which includes applying, at a halfway timestamp, a first phase of chopping at the first set of chopping switches and the second set of chopping switches, the halfway timestamp indicating a halfway point of an integration time (T_INT) for the integration cycle, where the first phase of chopping is applied at a first polarity, applying a second reset/initialization phase that resets the ADC and signal acquisition is re-initialized at the halfway point of the integration time (T_INT) for the integration cycle, wherein the second reset/initialization phase stops the integration cycle and changes a polarity of the integrator output, and applying, after the second reset/initialization phase, a second phase of chopping at the first set of chopping switches and the second set of chopping switches, where the second phase of chopping is applied at the first polarity. In some implementations, changing the polarity of the integrator output from a first polarity to a second polarity includes switching the output of the first set of chopping switches for the input terminals of the first amplifier, and switching the output of the second set of chopping switches for the input terminals of the second amplifier.

In some implementations, changing the polarity of the integrator output from a first polarity to a second polarity by switching the inputs from each set of chopping switches for each input terminal for each amplifier, respectively, eliminates the offset voltage across the photodiode.

Some embodiments of the subject matter described in this specification can be implemented so as to realize one or more of the following advantages. By using the disclosed circuit arrangement with two sets of chopping switches, dark current for each measurement may be cancelled. Additionally, this technique is useful to get the zero dark count for full temperature range with one auto zero operation at the start of integration, which enables the sensor arrangement to measure low light levels more accurately. Further, auto zero time can, in some cases, be reduced significantly because of lower auto zero digital-to-analog conversion (DAC) resolution. Moreover, in some instances, the sensor arrangement can also lower noise requirements in auto zero phase because of a large DAC step size. The sensor arrangement described in this disclosure also can be integrated easily into existing architecture.

The sensor arrangement can be used for both light sensing and temperature sensing applications using the same signal path for sensor signal acquisition. By using the same signal path for both sensors, the silicon area of the sensor arrangement can be kept small. Thus, the sensor arrangement can be produced, in some cases, at lower cost.

Preferably, the method is executed during an overall integration time to perform consecutive cycles of acquisition, wherein the sensor signal is integrated such as to build up charge stored by means of the analog-to-digital converter until the built up charge reaches a first reference potential. When the first reference potential has been reached, the built up charge is discharged with a reference charge during a determined time (e.g., a clock cycle). The number of counts provides a representation of the sensor signal.

The details of one or more embodiments of the subject matter described in this specification are set forth in the accompanying drawings and the description below. Other aspects, features, and advantages will become apparent from the description, the drawings, and the claims.

DETAILED DESCRIPTION

This disclosure describes a light sensor architecture for optimizing cancellation of dark current in each ambient light sensor (ALS) measurement with one auto zero (AZ) operation during initialization by utilizing chopping switches to measure low light levels accurately. The light sensor architecture has applications such as an ambient light sensor or color sensor where a light sensor is used to measure the level of light. Since light sensors are placed under dark glass, a larger photodiode area is needed to achieve a specified sensitivity for a given electrical gain from the light sensor. In turn, a larger photodiode area will increase the leakage current, and an increase in leakage current will limit the ability to detect low levels of light accurately.

Longer auto zero time and higher dark currents cause issues in the light sensor applications. These two factors restrict the light measurement at very low light conditions. Some light-to-frequency architectures used in light sensor devices use different auto zero digital-to-analog conversions (DAC) to achieve improved dark current performance by reducing the voltage offset across the photodiode. Even a small residual µV offset across the photodiode can cause large dark count at high temperatures. A 12-bit AZ DAC can have issues with repeatability of the AZ DAC code, and have a longer than desired AZ time. The repeatability issue with the AZ DAC is that the least significant bit (LSB) of the DAC is below the noise level. Thus, increasing the number of DAC bits to reduce the voltage offset across the photodiode tends to exacerbate these issues.

This document describes an arrangement that optimizes cancellation of dark current more accurately in less time by reducing the resolution of AZ-DAC. A larger DAC step size can improve the repeatability of the AZ code and noise requirements of the AZ-DAC. Additionally, an integrator amplifier using two sets of chopping switches allows the use of the bigger LSB of AZ DAC and cancels the dark count for each measurement. Because of chopping from the two sets of chopping switches, residual offset voltage changes with temperature and supply voltage after AZ will not impact the dark count, thus the light sensor can measure low light very precisely.

These features, as well as additional features, are described in more detail below.

Figure 1:
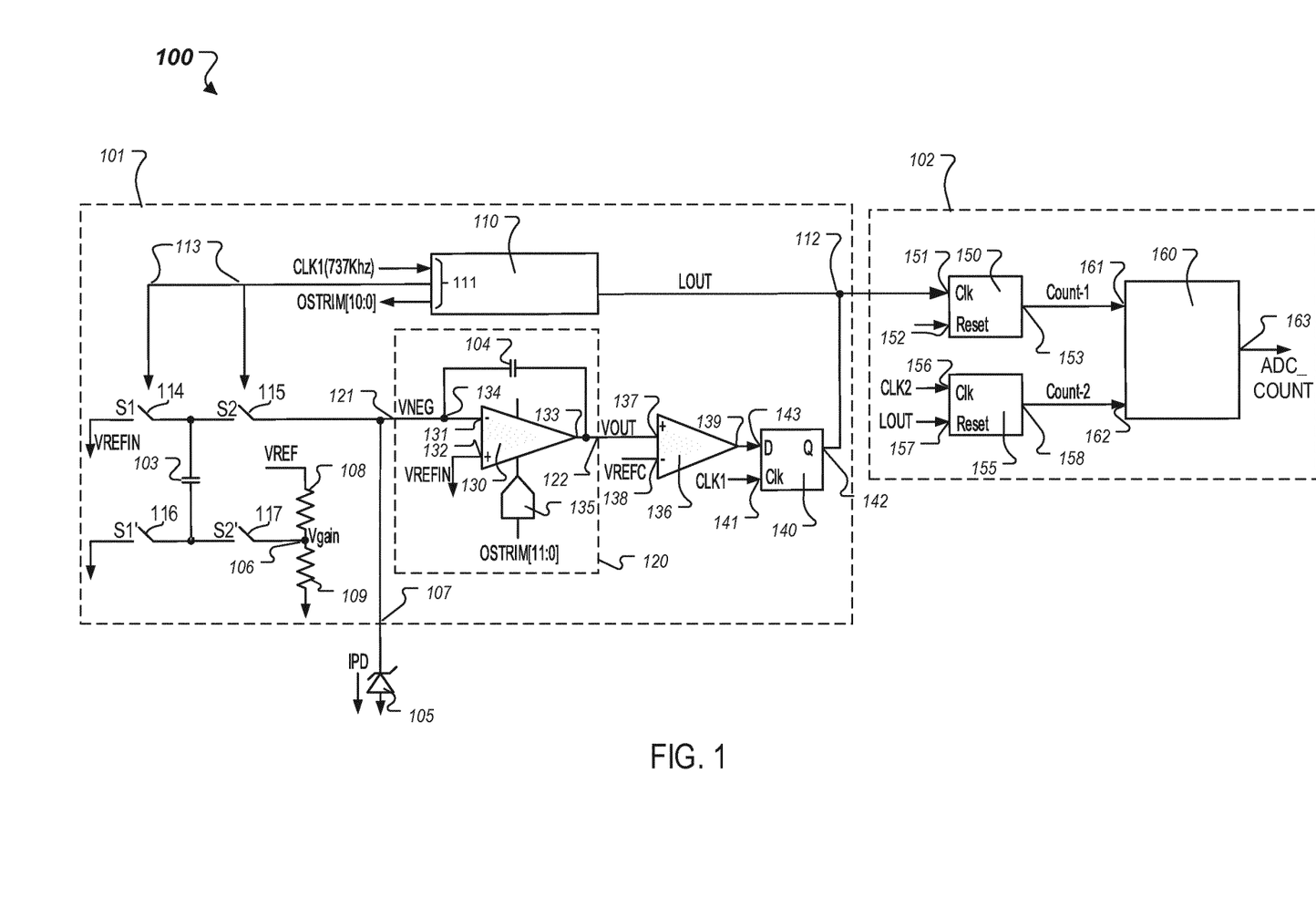
FIG. 1 is an example implementation of a sensor arrangement for light sensing.

FIG. 1 is an exemplary implementation of an optical sensor arrangement 100. The sensor arrangement 100 includes a photodiode 105 and an analog-to-digital converter (ADC) 101 (also referred to herein as converter 101). The sensor arrangement 100 also includes a signal processing unit 102. The converter 101 and the signal processing unit 102 are combined into a light-to-frequency converter which may be implemented as an integrated circuit.

In some implementations, the photodiode 105 is connected to the integrated circuit as an external component. Alternatively, the photodiode 105 can be a part of the integrated circuit in some embodiments. The light-to-frequency converter and photodiode can be considered an optical sensor arrangement. In some embodiments, the optical sensor arrangement is used as an ambient light sensor.

The photodiode 105 is coupled to an input 107 of the converter 101. The converter 101 includes an integrator 120 that, in turn, includes an amplifier 130, an integrator input 121, and an integrator output 122. The amplifier 130 includes an amplifier input 131 connected to the input 107 of the converter 101 which is connected to the integrator input 121. In some implementations, the amplifier input 131 is implemented as an inverting input. Alternatively, the amplifier input 131 can be implemented as a non-inverting input. The amplifier 130 includes a further amplifier input 132 that is designed as a non-inverting input, for example. The photodiode 105 connects the input 107 of the converter arrangement 101 to a reference potential terminal. A first bias source VREFIN couples the further amplifier input 132 to the reference potential terminal. An integrating capacitor 104 of the integrator 120 connects the amplifier input 131 to an amplifier output 133 of the amplifier 130.

The converter 101 includes a comparator 136 having a comparator input 137 that is connected to the amplifier output 133. The comparator input 137 is implemented as a non-inverting input, for example. A further comparator input 138 of the comparator 136 is designed as an inverting input, for example. A reference voltage source VREFC connects the further comparator input 138 to the reference potential terminal. An output 139 of the comparator 136 is connected to a digital control circuit 110. The digital control circuit 110 includes a control input 111 and control logic as well as one or more clock generators.

Further, the converter 101 includes a reference capacitor 103. The reference capacitor 103 is coupled via a reference switch 115 of the converter arrangement 101 to the input 107 of the converter 101. Thus, the reference capacitor 103 is coupled to the amplifier input 131 by the reference switch 115. A control output 113 of the digital control circuit 110 is connected to a control terminal of the reference switch 115. The first bias source VREFIN is coupled to the reference capacitor 103.

The reference capacitor 103 provides a variable capacitance value CREF. The capacitance value CREF of the reference capacitor 103 is set by a further capacitor control signal. The integrating capacitor 104 and the reference capacitor 103 can be programmed for different ambient light sensor gains, for example.

The converter 101 also includes several additional switches that are involved in resetting and charge dumping during the integration process: the reference switch 115, and first to third reference switches 114, 116, 117. The first reference switch 114 couples the first bias source VREFIN to a first electrode of the reference capacitor 103. The reference switch 115 couples the first electrode of the reference capacitor 103 to the amplifier input 131. The second reference switch 116 couples a second electrode of the reference capacitor 103 to a reference potential terminal. The third reference switch 117 couples node 106 to the second electrode of the reference capacitor 103. The reference source VREF generates a second reference voltage VGAIN at node 106 over a voltage divider circuit formed by two resistors 108, 109. For charging the reference capacitor 103, the first and the second reference switch 114, 116 are closed and the third reference switch 117 and the reference switch 115 are opened by a first and the second reference switch signal S1, S2. The first and the second reference switch signals S1, S2 are non-overlapping clock signals, for example. For dumping the charge package QREF to the amplifier input 131, the first and the second reference switch 114, 116 are opened and the third reference switch 117 and the reference switch 115 are closed by the first and the second reference switch signal S1, S2.

The comparator 136 can be implemented, for example, as a latched comparator. Comparator 136 has an output 139 which is connected to a first latch input 143 of a latch 140. The latch 140 includes a second latch input 141 to receive the first clock signal CLK1. A latch output 142 is connected to the result output 112 of the converter 101 and to the digital control circuit 110.

The comparator 136 and latch 140 are operated as a latched comparator. The latch 140 outputs the comparator output signal LOUT at output 112 at certain instances which are defined by the first clock signal CLK1. Due to the first clock signal CLK1, the latched comparator is only comparing the output voltage VOUT of amplifier 130 with the bias voltage VREF2 at certain intervals of the CLK1.

The signal processing unit 102 is connected to a result output 112 of the converter 101. The signal processing unit 102 further includes a first counter 150, a second counter 155 and a logic/calculation engine 160. The first counter 150 has a first clock input 151 which is connected to the result output 112. Furthermore, the first counter 150 has a first reset input 152. Similarly, the second counter 155 has a second clock input 156 and a second reset input 157. A first counter output 153 of the first counter 150 and a second counter output 158 of the second counter 155 are each connected to a calculation input 161 and 162, respectively, of the logic/calculation engine 160. Finally, the logic/calculation engine 160 includes a calculation output 163. The signal processing unit 102 can, at least in part, be implemented as a microcontroller.

Sensor signal acquisition is initialized by applying an input control signal ADC_ON and an integration time signal STINT to the control input 111 of the digital control circuit 110. Additionally, a first clock signal CLK1 can be provided to the control input 111. The first clock signal CLK1 can be provided by a clock generator and/or be generated by the digital control circuit 110. Preferably, the sensor arrangement 100 is cleared before signal acquisition proceeds. As the input control signal ADC_ON is provided to the control input 111 operation of the converter 101 is triggered. The first bias source VREFIN provides the amplifier reference voltage VREFIN to the reference capacitor 103. The reference capacitor 103 generates a charge package QREF. The charge package QREF has a value according to $$Q_{ref} = V_{ref,in} \cdot C_{ref}$$

where $C_{ref}$ is a capacitance value of the reference capacitor 103 and $V_{ref,in}$ is a voltage value of the amplifier reference voltage. The digital control circuit 110 provides a reference switch signal S2 to the reference switch 115. After closing the reference switch 115, the charge package QREF is applied to the integration node 134. Furthermore, the first and second counters 150, 155 are reset by applying a reset signal SRESET to the first and second reset inputs 152, 157, respectively.

Depending on an input control signal ADC_ON, and after the sensor arrangement 100 has been set or cleared to an initial condition, the photodiode 105 starts signal acquisition and generates a photo-current IPD. The value of the photocurrent depends on the intensity of the light incident on the photodiode 105. The photocurrent IPD flows through the photodiode 105 and the input 107 of the converter 101. Each of the photodiode 105, the amplifier input 131 and the integrating capacitor 104 is connected to an integration node 134. In addition, the reference capacitor 103 is coupled to the integration node 134 via the reference switch 115. The sensor current IPD flows from the integration node 134 to the reference potential terminal with a positive value. An input voltage VNEG is tapped at the amplifier input 131 and, thus, also at the integration node 134. The first bias source VREFIN provides an amplifier reference voltage VREFIN to the further amplifier input 132. The amplifier 130 generates an output voltage VOUT at the amplifier output 133.

In the case the reference switch 115 is open, the photocurrent IPD is integrated on the integrating capacitor 104. The output voltage VOUT rises with time t as:

$$V_{OUT} = I_{PD} \cdot t \cdot C_{INT}$$

where $I_{PD}$ is a value of the photocurrent and $C_{INT}$ denotes a capacitance value of the integrating capacitor 104.

The output voltage VOUT of the amplifier 130 is applied to the comparator input 137. The reference voltage source VREF generates a bias voltage VREF2 which then is applied as a comparator reference voltage VREFC to the comparator input 138. The comparator 136 generates a comparator output signal LOUT based on the values of the output signal VOUT and of the comparator reference voltage VREFC. The comparator output signal LOUT has a first logical value if the output voltage VOUT is larger than the comparator reference voltage VREFC and has a second logical value if the output voltage VOUT is smaller than the comparator reference voltage VREFC. The comparator output signal LOUT is provided to the digital control circuit 110.

During signal acquisition, the signal processing unit 102 counts the pulses of the comparator output signal LOUT. Basically, the counting is performed by the first counter 150. Together, the converter 101 and the first counter 150 can be considered a first order modulator that generates an asynchronous count COUNT-1 (abbreviated as C1, hereinafter). The asynchronous count C1 is directly proportional to the photocurrent IPD integrated on the integrating capacitor 104 (within an error margin). According to some implementations, the asynchronous count C1 may be prone to error, which is accounted for by the signal processing engine 40. The first counter 150 provides the asynchronous count C1. This count, however, only comprises an integer number of individual counts.

The second counter 155 can be considered a free running counter operating on a second clock signal CLK2 received at the second clock input 156. The second clock signal CLK2 can be provided by a clock generator (not shown) and/or by the digital control circuit 110. The second counter 155 is reset by receiving the comparator output signal LOUT at the second reset input 157. The second counter 155 generates a time count COUNT-2 (abbreviated as C2, hereinafter) that resolves a time period between adjacent periods or time intervals of the asynchronous count C1. In some implementations, the second clock signal CLK2 is implemented with a higher frequency when compared with the first clock signal CLK1. For example, the first clock signal CLK1 can have a rectangular function with a frequency of 737 kHz, and the second clock signal CLK2 can have a rectangular function with a frequency of 2 MHz. Alternatively, other clock signal frequencies can be used for the first clock signal CLK1 and the second clock signal CLK2.

In some implementations, the digital control circuit 110 initializes and also terminates signal acquisition after the integration time (T_INT) has run through. The integration time (T_INT) is set at the digital control circuit 110 depending on an integration time signal.

In some implementations, the first bias source VREFIN is omitted, and the amplifier reference voltage VREFIN is zero.

As discussed, the basic operation principle of an ALS circuit, such as the sensor arrangement 100 as shown in FIG. 1, is that the charge balancing analog-to-digital converter (ADC), collects the photon current from photodiode and converts it to an ALS count (ADC-COUNT). ALS count is based on a charge conservation equation:

$$ADC\_COUNT = (T_{int} * I_{pd}) / (C_{ref} * V_{ref})$$

where $T_{int}$ is a total conversion time, $I_{pd}$ is a value of the photocurrent, $C_{ref}$ is the capacitance value of the reference capacitor, Vref is the reference voltage. During a completely dark light condition, ideally, the photodiode will not generate any current, and the number of ADC counts is zero. In actual implementations, however, if the voltage across the photodiode is not zero, the photodiode PD will be leaky, and the leakage current is calculated based on the leak current equation:

$$I_{leak} = I_S * [e^{(V_{neg}/(kT/q))} - 1]$$

where $I_{leak}$ is the leakage current, $I_S$ is the reverse bias saturation current (or scale current), and Vneg is the value of the input voltage. "kT/q" is the Boltzmann constant, k, times temperature, T, divided by electron charge, q, which also is known as the thermal voltage $V_T$. The leakage current can grow exponentially with an increase temperature, and would thus cause problems for the ambient light sensor. For example, a finite dark count (Dark_COUNT: ADC_COUNT when light is zero) may be present and can limit the sensor's lower bound performance:

$$Dark\_COUNT = (T_{int} * I_{leak}) / (C_{ref} * V_{ref})$$

This leakage current is very high at 70 degrees with the highest gain (e.g., 512x). The leakage current can be a limiting factor for the performance of the ambient light sensor (ALS), such as sensor arrangement 100. Total ALS measurement time for every ALS integration cycle can be calculated by the equation:

ALS Measurement Time=AZ_Time+Init_Time+ALS_Integration_Time where Init_Time is an initialization time and is a fixed time (e.g., 100 µs) irrespective of the gain, and AZ DAC and ALS_Integration_Time is a fixed time (e.g., 100 ms). AZ_Time is the auto zero time, and the auto zero time varies with the number of bits in the AZ DAC and the algorithm used to find the AZ code. For example, the higher the bits with the AZ DAC, the higher the AZ time. As the number of DAC bits increases, the overhead time in ALS measurement increases, can be the origin of the biggest overhead time in ALS measurements.

In some implementations, a user can program the integration time. For example, according to some implementations, a range of integration time (T_INT) can vary from 2.78 ms to 1400 ms. Alternatively, a different range of integration times can be used.

A sensor arrangement (and corresponding timing diagrams) that utilizes two sets of chopping switches and two different chopping techniques in order to cancel the dark current, and reduce auto zero time with lower AZ DAC resolution, are described below with reference to FIGS. 2-4.

Figure 2A:
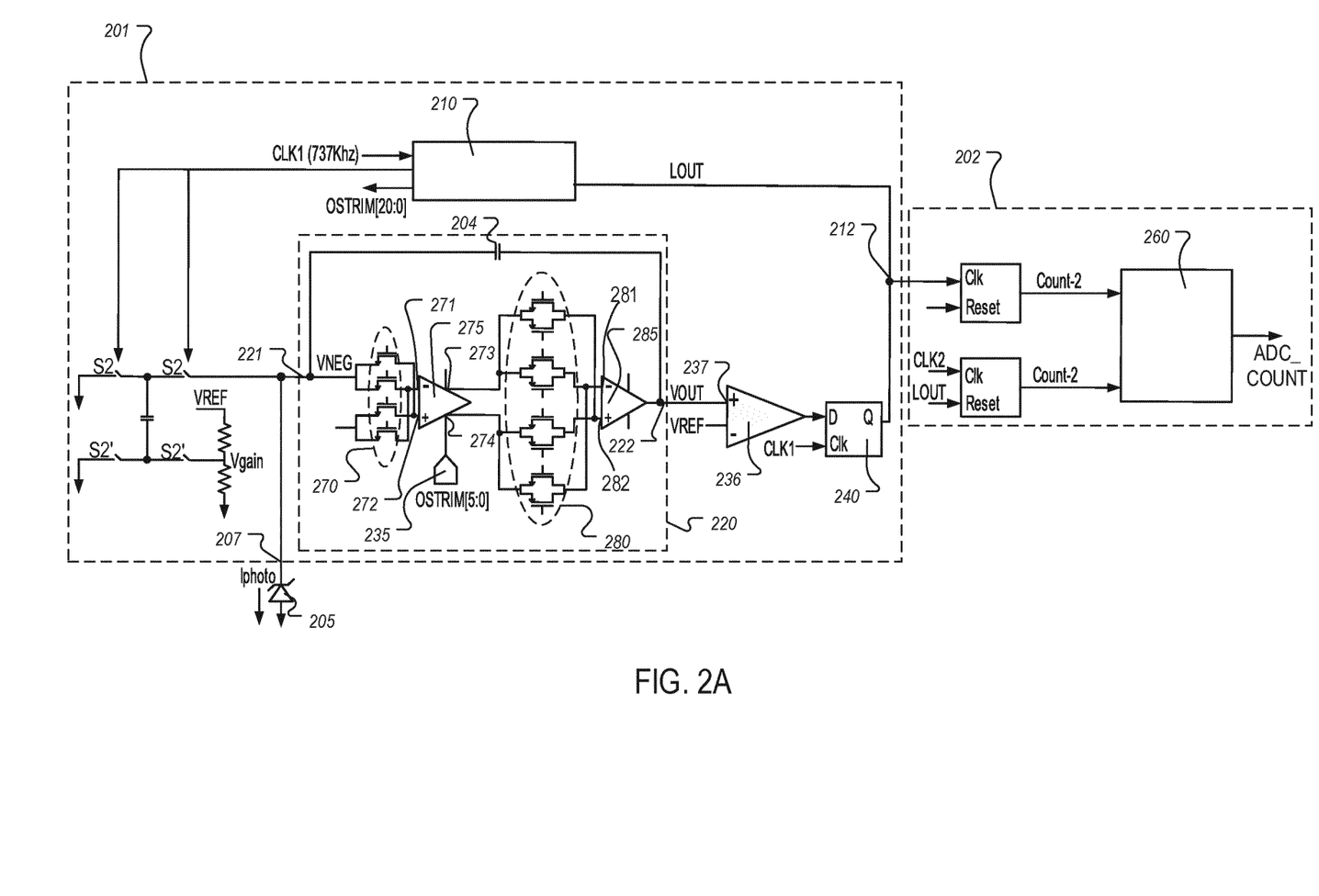
FIGS. 2A-2C are an example implementation of a sensor arrangement for light sensing with two sets of chopping switches.
Figure 2B:
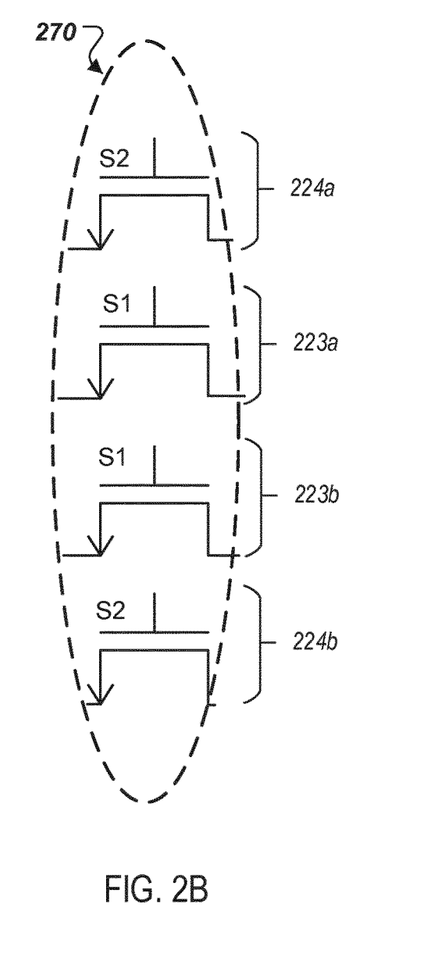
Figure 2C:
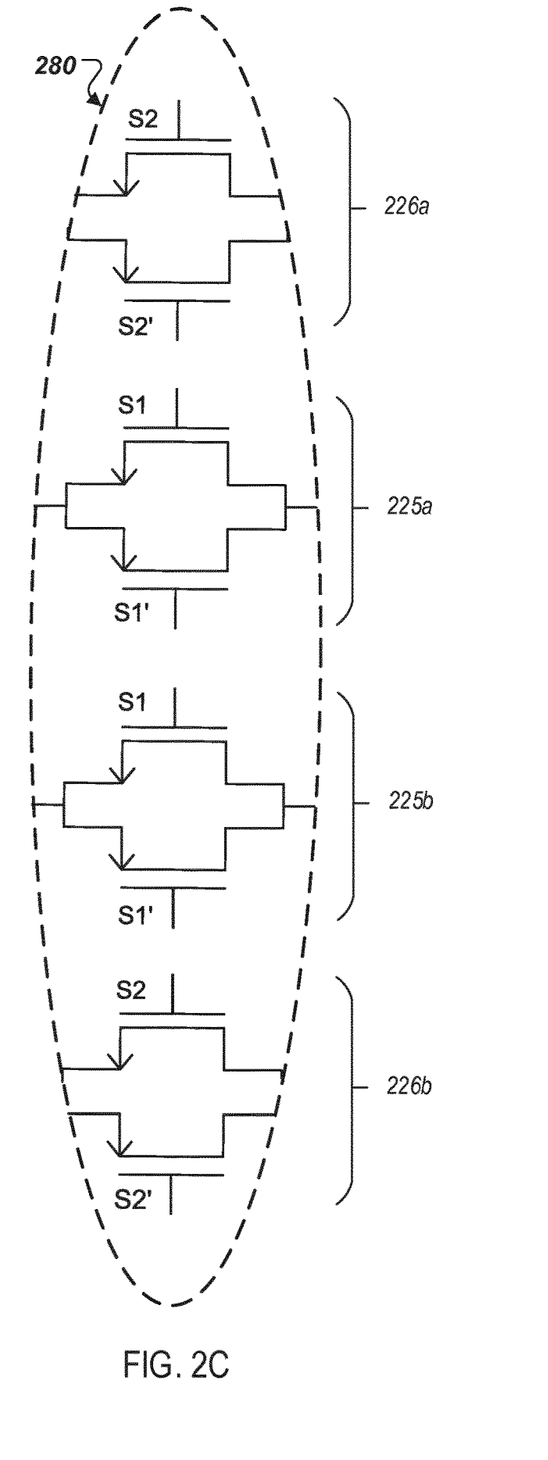

FIG. 2 is an exemplary implementation of an optical sensor arrangement 200. The sensor arrangement 200 has a topology similar to the sensor arrangement 100 shown in FIG. 1, except that the analog-to-digital converter (ADC) 201 (also referred to herein as converter 201) includes an integrator 220 different from the integrator 120 discussed for FIG. 1. For example, sensor arrangement 200 includes a photodiode 205, a converter 201 (other than a different integrator 220), and a signal processing unit 202, similar to that of the sensor arrangement 100. Thus, it can be assumed that the same components in FIG. 2, other than those components discussed herein regarding the integrator 220, are comparable to those components discussed with reference to FIG. 1.

In some implementations, the sensor arrangement 200 is used for light-to-frequency conversion for light sensing. The converter 201 depends on a first clock signal (CLK1), and is configured to convert a photocurrent (IPD) generated by the photodiode 205 into the digital comparator output signal (LOUT). The ADC arrangement 201 includes a sensor input 207 for connecting the photodiode 205, a result output 212 for providing the digital comparator output signal (LOUT) to the signal processing unit 202, and an integrator 220.

The signal processing unit 202 is similar to the signal processing unit 102 of FIG. 1. The signal processing unit 202 is connected to a result output 212 of the converter 201. The signal processing unit 202 further includes a first counter, a second counter, and a logic/calculation engine 260. The signal processing unit 202 can, at least in part, be implemented as a micro-controller. The signal processing unit 202 is configured to determine from the digital comparator output signal (LOUT) a digital output signal (ADC-COUNT) comprising an asynchronous count (C1) comprising an integer number of counts depending on the first clock signal (CLK1) and including a fractional time count (C2) depending on a second clock signal (CLK2). The digital output signal (ADC-COUNT) is indicative of the photocurrent generated by the photodiode 205.

In some implementations, integrator 220 includes an integrator input 221 that is coupled electrically to the sensor input 207 to receive an integrator input signal, and an integrator output 222 for generating an integrator output signal (OPOUT). The integrator 220 includes a first set of chopping switches 270 connected to a first amplifier 275. The first set of chopping switches 270 are shown further in FIG. 2B, and includes chopping switches 223a, 223b, 224a, and 224b. The first set of chopping switches are adapted to chop the integrator input signal to the amplifier 275 inputs 271, 272. The outputs 273, 274 of the amplifier 275 are connected to the second amplifier 285.

The integrator 220 further includes the second set of chopping switches 280 connected to a second amplifier 285. The second set of chopping switches 280 are shown further in FIG. 2C, and includes chopping switches 225a, 225b, 226a, and 226b. The second set of chopping switches 280 are adapted to chop the output signal of the first amplifier 275 at the inputs 281, 282 of the second amplifier 285. The output of the amplifier 285 is connected to the integrator output 222 which is connected to the input 237 of the comparator 236. According to some implementation, the second set of chopping switches 280 are configured to switch the polarity of the output of the first set of chopping switches 270. Switching the polarity is referred to herein as chopping technique-2.

The comparator 236 and latch 240 are operated as a latched comparator. The latch 240 outputs the comparator output signal LOUT to output 212 at certain instances which are defined by the first clock signal CLK1. Due to the first clock signal CLK1, the latched comparator is only comparing the output voltage VOUT of integrator 220 with the bias voltage VREF2 at certain intervals of the CLK1.

In some implementations, the converter 201 is operated using a chopping technique. According to some implementations, the chopping technique that is utilized can be controlled by a digital control circuit 210. The chopping techniques described in this disclosure are illustrated and discussed below with reference to FIG. 3.

Figure 3A:
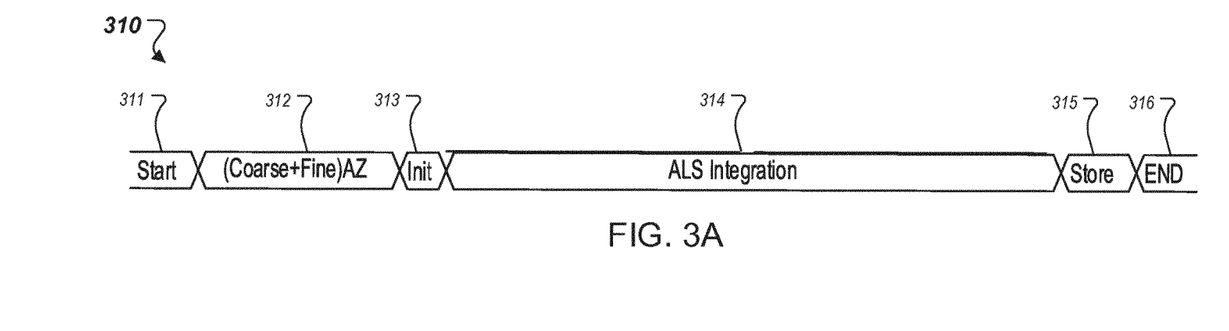
FIGS. 3A-3C are block diagrams of three example ambient light sensor states for sensor arrangements for light sensing.
Figure 3B:
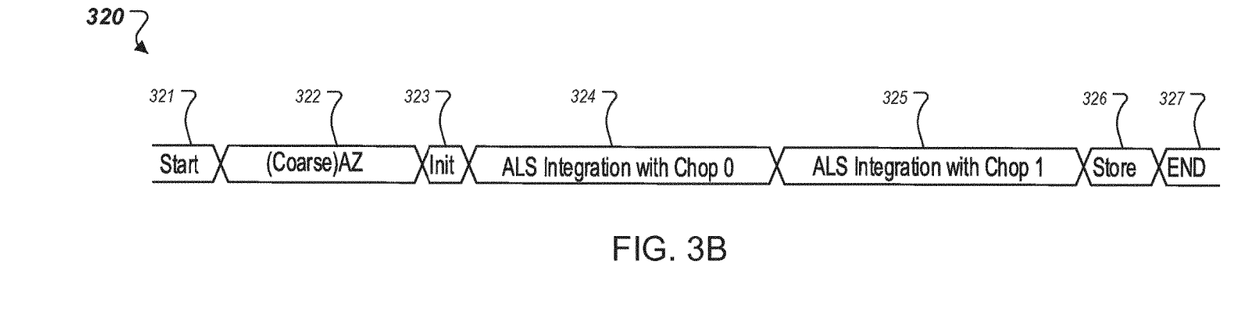
Figure 3C:
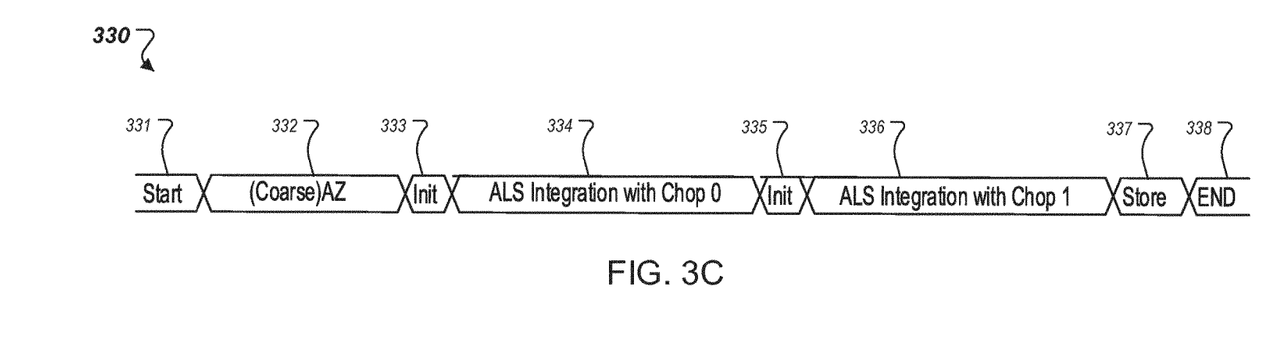

FIGS. 3A-3C are block diagrams of three example ambient light sensor states for sensor arrangements for light sensing. In particular, FIG. 3A illustrates block diagram 310 as an example of an ambient light sensor state used by a sensor arrangement that do not use chopping circuits, such as sensor arrangement 100. FIGS. 3B and 3C illustrate block diagrams 320, 330, respectively, as example ambient light sensor states used by a sensor arrangement that uses chopping circuits, such as sensor arrangement 200, according to a chopping technique.

The ambient light sensor state in FIG. 3A begins at start block 311 during one ambient light sensor measurement during a total integration time (T_INT). Next, at block 312, mixed segmented (coarse) and binary weighted (fine) operations are applied by a DAC, such as converter 101 of the sensor arrangement 100, as an auto zero operation at the start of the integration before a reset/initialization phase.

At block 313, a reset/initialization phase of the ambient light sensor measurement occurs following the coarse and fine auto zero operation. For example, sensor signal acquisition is initialized by applying an input control signal ADC_ON and an integration time signal STINT to the control input 111 of the digital control circuit 110 for the converter 101 in FIG. 1. According to some implementations, after the converter is reset, signal acquisition can be initialized by setting the input control signal ADC_ON from low to high. The integration time signal STINT transits from low to high at the same time and the converter, such as converter arrangement 101, starts the operation.

The ambient light sensor integration operation begins at block 314, following the reset/initialization phase. For example, the photocurrent IPD generated by the photodiode 105 is integrated by the integrator 120 which includes the amplifier 130 and the integrating capacitor 104, as discussed above with reference to FIG. 1. The photocurrent IPD is integrated at the integration node 134 and the output voltage VOUT is ramping up during integration. The comparator 136 monitors the output voltage VOUT of the integrator that is the output voltage VOUT of the amplifier 130. When the output voltage VOUT is larger than the comparator reference voltage VREFC, the comparator output signal LOUT is high and a charge packet (e.g., $Q_{ref}=V_{ref,in} \cdot C_{ref}$) is dumped into the integration node 134. The output signal LOUT is received at the first counter and the asynchronous count C1 is incremented by one count.

The ADC_COUNT output of the ambient light sensor measurement from a logic/calculation engine, such as logic/calculation engine 160 of signal processing unit 102 for FIG. 1, is stored at block 315. The ambient light sensor state in FIG. 3A ends at end block 316 after the integration time (T_INT) has expired, which signifies the end of one ambient light sensor measurement. For example, the digital control circuit 110 not only initializes, but also terminates signal acquisition after the integration time (T_INT) is completed. According to some implementations, the integration time (T_INT) is set at the digital control circuit 110 depending on the integration time signal STINT.

FIG. 3B illustrates block diagram 320 as an example ambient light sensor state used by a sensor arrangement that uses chopping circuits, such as sensor arrangement 200, according to a first chopping technique.

The ambient light sensor state for the first chopping technique begins at start block 321 during one ambient light sensor measurement during a total integration time (T_INT). Next, an initial phase begins at blocks 322 and 323, before a chopping technique is applied. In particular, at block 322, a segmented (coarse) operation is applied by a DAC, such as converter 201 of the sensor arrangement 200, as an auto zero operation at the start of the integration before a reset/initialization phase.

At block 323, a reset/initialization phase of the ambient light sensor measurement occurs following the coarse auto zero operation. For example, sensor signal acquisition is initialized by applying an input control signal ADC_ON and an integration time signal STINT to the control input of the digital control circuit 210 for the converter 201 in FIG. 2. According to some implementations, after the converter 201 is reset, signal acquisition can be initialized by setting the input control signal ADC_ON from low to high. The integration time signal STINT transits from low to high at the same time and the converter 201 starts the operation.

According to some implementations, the sensor arrangement 200 uses an AZ DAC with a higher LSB (e.g., 1 LSB=~100 µV) for the chopping techniques. The auto zero is performed in the initialization phase of block 323, which can get the offset voltage across photodiode 205 to the reasonable level (e.g., below ~100 µV). Below the offset voltage, diode V-I characteristics are linear, and therefore can use the chopping techniques in the integration time (T_INT) to cancel the dark current.

The ambient light sensor integration operation for the first chopping technique begins at block 324, following the initial phase which includes applying a coarse auto zero operation (block 322) and applying the reset/initialization phase (block 323). Each of the chopping techniques described herein are based on the integration time (T_INT) for the integration cycle. This is the continuous process and applies the residual offset across the photodiode with both the polarities, and averages out the offset effect on the photo diode and eliminates the dark current for each measurement. The chopping techniques are applied inside the integrator 220 loop and do not pose issues with the settling behavior of the integrator 220.

In particular, for the first chopping technique, the integration starts with a first phase of chopping by the integrator 220 at both the first set of chopping switches 270 and the second set of chopping switches 280 at block 325. The first phase of chopping is referred to as "ALS Integration with Chop 0", and is also referred to herein as "Chop 0". The first phase of chopping is applied at a first polarity. For example, a +Ve offset across the input terminals of the first amplifier in Chop 0. The integration initially is similar to block 324 until halfway through the total integration time (T_INT). Chopping then is applied for the second half of the integration time (T_INT) without stopping the integration at block 325. Because of the residual, offset is applied across the diode with both of the polarities. For example, the photocurrent IPD generated by the photodiode 205 is integrated by the integrator 220 that includes the amplifier 230 and the integrating capacitor 204. The photocurrent IPD is integrated at the integration node and the output voltage VOUT is ramping up during integration. The comparator 236 monitors the output voltage VOUT of the integrator that is the output voltage VOUT of the amplifier 230. When the output voltage VOUT is larger than the comparator reference voltage VREFC, the comparator output signal LOUT is high and a charge packet (e.g., $Q_{ref} = V_{ref,in} \cdot C_{ref}$) is dumped into the integration node. The output signal LOUT is received at the first counter and the asynchronous count C1 is incremented by one count.

The count will continue by signal processing unit 202 throughout the total conversion time (T_INT), however, at halfway of the integration time (T_INT), the second phase of chopping is applied by the integrator 220 at both the first set of chopping switches 270 and the second set of chopping switches 280 at block 325 (e.g., Chop 1). The second phase of chopping is referred to as "ALS Integration with Chop 1", and is also referred to herein as "Chop 1". The second phase of chopping is applied at a different polarity than the first polarity from the first phase of chopping. For example, a +Ve offset across the input terminals of the first amplifier in Chop 0 during the first phase of chopping, would result in a −Ve offset across the input terminals of the first amplifier in Chop 1 during the second phase of chopping. The integration will continue at block 325, however, when chopping is applied after half of the integration time (T_INT), this can cause a small change in the output voltage and slope of the integration based on the leakage current, which could introduce sub-zero dark count. The first chopping technique is described further with reference to FIG. 4D.

The ADC_COUNT output of the ambient light sensor measurement from a logic/calculation engine, such as logic/calculation engine 260 of signal processing unit 202, is stored at block 326. The ambient light sensor state in FIG. 3B ends at end block 327 after the integration time (T_INT) has expired, which signifies the end of one ambient light sensor measurement. For example, the digital control circuit 210 not only initializes, but also terminates, signal acquisition after the integration time (T_INT) has completed. According to some implementations, the integration time (T_INT) is set at the digital control circuit 210 depending on an integration time signal STINT.

FIG. 3C illustrates block diagram 330 as an example ambient light sensor state used by a sensor arrangement that uses chopping circuits, such as sensor arrangement 200, according to a second chopping technique.

The ambient light sensor state for the first chopping technique begins at start block 331 during one ambient light sensor measurement during a total integration time (T_INT). Next, an initial phase begins at blocks 332 and 333, before a chopping technique is applied. In particular, at block 332, a segmented (coarse) operation is applied by a DAC, such as converter 201 of the sensor arrangement 200, as an auto zero operation at the start of the integration before a reset/initialization phase.

A first reset/initialization phase of the ambient light sensor measurement occurs following the coarse auto zero operation at block 333. For example, sensor signal acquisition is initialized by applying an input control signal ADC_ON and an integration time signal STINT to the control input of the digital control circuit 210 for the converter 201 in FIG. 2. According to some implementations, after the converter 201 is reset, signal acquisition can be initialized by setting the input control signal ADC_ON from low to high. The integration time signal STINT transits from low to high at the same time and the converter 201 starts the operation.

According to some implementations, the sensor arrangement 200 uses an AZ DAC with a higher LSB (e.g., 1 LSB=~100 µV) for the chopping techniques. The auto zero is performed in the first initialization phase of block 333, which can bring the offset voltage across photodiode 205 to a reasonable level (e.g., below ~100 µV). Below the offset, diode V-I characteristics are linear, and therefore can use the chopping techniques in the integration time (T_INT) to cancel the dark current.

The ambient light sensor integration operation for the second chopping technique begins at block 334, following the initial phase which includes applying a coarse auto zero operation (block 332) and applying the reset/initialization phase (block 333). Each of the chopping techniques described here are based on the integration time (T_INT). This is the continuous process and applies the residual offset across the photodiode with both the polarities, and averages out the offset effect on the photo diode and eliminates the dark current for each measurement. The chopping techniques are applied inside the integrator 220 loop and do not pose issues with the settling behavior of the integrator 220.

In particular, for the second chopping technique, the integration starts with a first phase of chopping by the integrator 220 at both the first set of chopping switches 270 and the second set of chopping switches 280 at block 325. The first phase of chopping is referred to as "ALS Integration with Chop 0", and is also referred to herein as "Chop 0". The first phase of chopping is applied at a first polarity. For example, a +Ve offset across the input terminals of the first amplifier in Chop 0. The integration initially is similar to block 324 until halfway through the total integration time (T_INT). Chopping then is applied for the second half of the integration time (T_INT) without stopping the integration at block 325. Because of the residual, offset is applied across the diode with both of the polarities. For example, the photocurrent IPD generated by the photodiode 205 is integrated by the integrator 220 comprising the amplifier 230 and the integrating capacitor 204. The photocurrent IPD is integrated at the integration node and the output voltage VOUT is ramping up during integration. The comparator 236 monitors the output voltage VOUT of the integrator that is the output voltage VOUT of the amplifier 230. When the output voltage VOUT is larger than the comparator reference voltage VREFC, the comparator output signal LOUT is high and a charge packet (e.g., $Q_{ref} = V_{ref,in} \cdot C_{ref}$) is dumped into the integration node. The output signal LOUT is received at the first counter and the asynchronous count C1 is incremented by one count.

At block 335, a second reset/initialization phase of the ambient light sensor measurement occurs at halfway of the integration time (T_INT) before a second phase of chopping (e.g., Chop 1) is applied. For example, sensor signal acquisition is re-initialized by applying an input control signal ADC_ON and an integration time signal STINT to the control input of the digital control circuit 210 for the converter 201 in FIG. 2. According to some implementations, after the converter 201 is reset, signal acquisition can be re-initialized by setting the input control signal ADC_ON from low to high. The integration time signal STINT transits from low to high at the same time and the converter 201 starts the operation.

Following the second reset/initialization phase, a new ambient light sensor measurement is initiated, a second phase of chopping then is applied for the second half of the integration time (T_INT) at block 336 (e.g., Chop 1). The second phase of chopping is referred to as "ALS Integration with Chop 1", and is also referred to herein as "Chop 1". Because the second reset/initialization phase was applied at block 335, the second phase of chopping is applied at the same polarity as the first phase of chopping. For example, a +Ve offset across the input terminals of the first amplifier in Chop 0 during the first phase of chopping, would result in a +Ve offset across the input terminals of the first amplifier in Chop 1 during the second phase of chopping. Because of the residual, offset is applied across the diode with both of the polarities. The count will continue by signal processing unit 202 throughout the total conversion time T_INT. The integration will continue at block 336, however, by applying chopping after half of the integration time (T_INT) after the second reset/initialization phase, the output change during switching on the output signal information when there is switching in chopping switches can be eliminated. The second chopping technique is described further with reference to FIG. 4E.

The ADC_COUNT output of the ambient light sensor measurement from a logic/calculation engine, such as logic/calculation engine 260 of signal processing unit 202, is stored at block 337. The ambient light sensor state in FIG. 3B ends at end block 338 after the integration time (T_INT) has expired, which signifies the end of one ambient light sensor measurement. For example, the digital control circuit 210 not only initializes, but also terminates signal acquisition after the integration time (T_INT) has completed. According to some implementations, the integration time (T_INT) is set at the digital control circuit 210 depending on an integration time signal STINT.

Figure 4A:
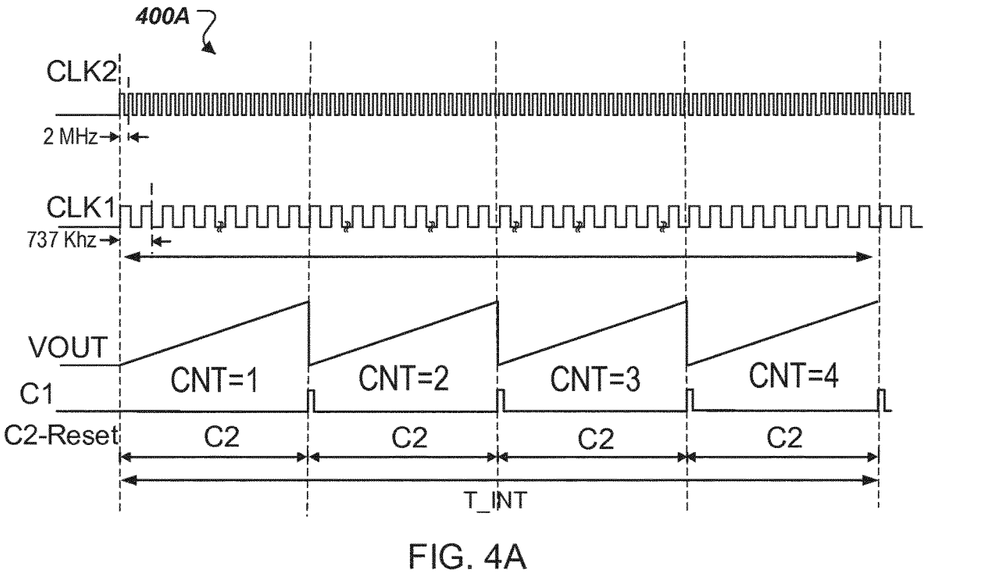
FIGS. 4A-4E are timing diagrams of pulse width modulated control waveforms for sensor arrangements for light sensing.

FIG. 4A shows an exemplary timing diagram 400A of signals of the exemplary embodiment of an ideal optical sensor arrangement with ideal waveforms and an ideal expected ADC code of 4 for the circuit of FIG. 1. The drawing shows the different signals and operation of a light-to-frequency converter. Depicted are the first clock signal CLK1 and the second clock signal CLK2. In the illustrated example, the clock signals are implemented as rectangular functions having a frequency of 737 kHz and 2 MHz, respectively. These values should be considered as examples only and are not restricted to these exact values. Typically the frequency of the first clock signal CLK1 is chosen to be lower than the frequency of the second clock signal CLK2. Further, the drawing shows the output voltage VOUT of the integrator, such as integrator 120 or 220. Finally, FIG. 4A shows the asynchronous count C1 and the time count C2. The signals are represented as functions of time (t). As signal acquisition proceeds for a certain integration time (T_INT) the integration time (T_INT) is shown as a means of reference.

The basic operation principle of an optical sensor arrangement is based on the concept of a charge-balancing converter. The converter 101 collects light which is converted into a photocurrent IPD from the photodiode 105 which by several steps is converted into counts. Ideally the number of counts C1 measured during the integration time (T_INT) is a direct measure of the photocurrent IPD. The resulting asynchronous count C1 is complemented with various error estimates which can be derived from the time count C2.

The basic operation principle is implemented by the various components of the optical sensor arrangement. The converter 101 is designed as a charge-balancing converter and is used to convert the photocurrent IPD to a digital count in the form of the digital output signal ADC-COUNT. The photocurrent IPD is integrated into the integration node 134 and the integration capacitor 104 generates the input voltage VNEG. If the charge integrated into the integration capacitor 104 is larger than the unit charge packet QREF, the charge on the integration capacitor 104 will be decreased by one unit charge packet and the first counter 150 will be incremented by one logical value. The integration time signal STINT determines an integration time (T_INT). By integrating the photocurrent IPD during the integration time (T_INT), the asynchronous count C1 will result in a measure of the intensity of light incident on the photodiode 105. The integration time (T_INT) may be 100 ms, for example. Alternatively, the integration time (T_INT) may be a different length of time (e.g., a multiple of a period of the first clock signal CLK1). In this embodiment the comparator reference voltage VREFC is constant and equal to the bias voltage VREF2.

An exemplary measurement cycle may involve the following operations. Initially, when the input control signal ADC_ON is low, the converter 101 is reset. Resetting the converter 101 may involve clearing the photodiode 105; clearing the integration capacitor 104; resetting the input voltage VNEG to the amplifier reference voltage VREFIN; resetting the output voltage VOUT to the first reference voltage VREF1 and thus lower than the comparator reference voltage VREFC. As a consequence, the comparator output signal LOUT is low. The reference capacitor 103 is fully charged with the charge package QREF and disconnected from the integration node 134. The first and second counters 150, 155 are cleared so that the digital output signal at the calculation output 163 is 0. The second reference switch signal S2 applied to the reference switch 115 is low.

After the converter is reset, signal acquisition can be initialized by setting the input control signal ADC_ON from low to high. The integration time signal STINT transits from low to high at the same time and the converter 101 starts operation. The photocurrent IPD generated by the photodiode 105 is integrated by an integrator comprising the amplifier 130 and the integrating capacitor 104. The photocurrent IPD is integrated at the integration node 134 and the output voltage VOUT is ramping up during integration. The comparator 136 monitors the output voltage VOUT of the integrator that is the output voltage VOUT of the amplifier 130. When the output voltage VOUT is larger than the comparator reference voltage VREFC, the comparator output signal LOUT is high and a charge packet ($Q_{ref}=V_{ref,in} \cdot C_{ref}$) is dumped into the integration node 134. The output signal LOUT is received at the first counter and the asynchronous count C1 is incremented by one count.

After the charge dumping the output voltage VOUT is reduced by the value $V_{ref,in} \cdot C_{ref}/C_{int}$. The output voltage VOUT returns back to low, i.e., the level of the first reference voltage, VREF1, is lower than the comparator reference voltage VREFC, and ramps up back again. The charge packet circuit (e.g., reference capacitor 103) is disconnected from the integration node 134 and returns to a recharging mode. A number N of dumpings is increased by one count. The output voltage VOUT swings between the first reference voltage VREF1 and the bias voltage VREF2. This process is characterized by a charge dumping period CDP and will repeat itself until the integration time (T_INT) is over, and the signal STINT transits from high to low. During the integration time (T_INT), the signal STINT is high, and the number counts are accumulated by the first counter 150. The counter value C1 is equal to the number N of dumpings and provides a first measure of the intensity of the incident light. The asynchronous count C1 is equal to the number N of dumpings counted by the first counter 150. The number N of charge dumpings is equal to the counts of the first counter 150 of the converter 101 generated over the period defined by the integration time (T_INT).

As shown in FIG. 4A, four ideal integration periods of C2 are shown to follow the expected ADC code of 4. The time count C2 is reset via the second reset input 157 every time a full charge dumping period is completed. The second counter 155 resolves a period between adjacent counts in the asynchronous count C1. Thus, every time an integration cycle is completed and a charge is dumped, the number N of dumpings is increased by one count in the asynchronous count C1 by the first counter 150. The second counter 155 generates the time count C2 which is a digital value that determines a time period or duration for the respective integration cycle.

Figure 4B:
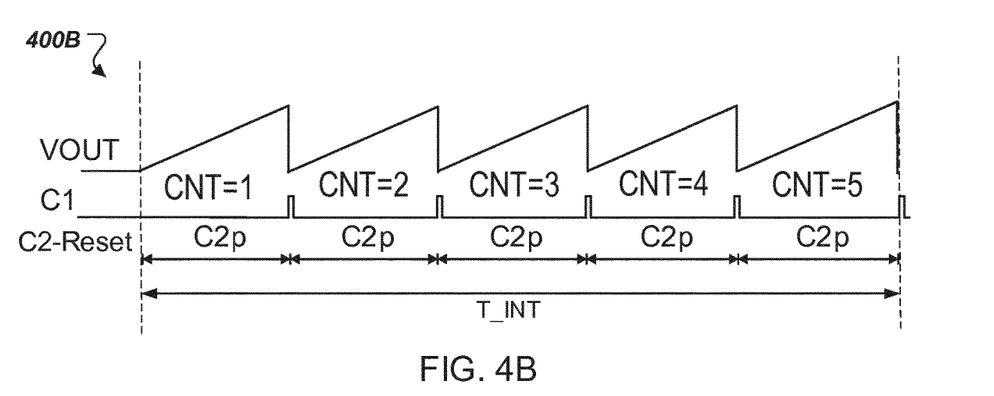

FIG. 4B shows an exemplary timing diagram 400B of signals of the exemplary embodiment of an optical sensor arrangement having an ADC code of 5 and a +Ve offset condition for the circuit of FIG. 1. The drawing shows the different signals and operation of a light-to-frequency converter. Depicted in FIG. 4B is the output voltage VOUT of the integrator 120. In addition, the asynchronous count C1 and the time count C2 are shown. The signals are represented as functions of time t. As signal acquisition proceeds for a certain integration time (T_INT), the integration time (T_INT) is shown as a means of reference. As shown in FIG. 4B, five integration periods of C2$p$ are shown to follow the ADC code of 5.

Not depicted in FIGS. 4B-4E are the first clock signal CLK1 and the second clock signal CLK2. However, it can be assumed for these example implementations that the clock signals also are implemented as rectangular functions having a frequency of 737 kHz and 2 MHz, respectively. These values should be considered as examples only and are not restricted to these exact values. Typically the frequency of the first clock signal CLK1 is chosen to be lower than the frequency of the second clock signal CLK2.

Figure 4C:
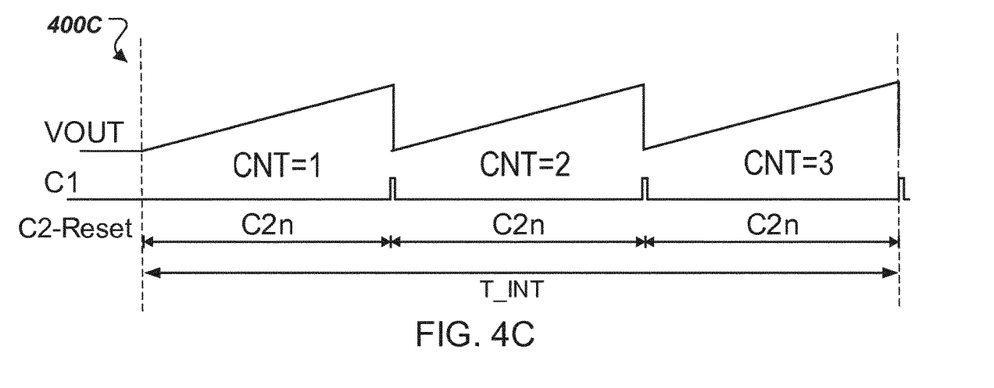

FIG. 4C shows an exemplary timing diagram 400C of signals of the exemplary embodiment of an optical sensor arrangement having an ADC code of 3 and a −Ve offset condition for the circuit of FIG. 1. The drawing shows the different signals and operation of a light-to-frequency converter. Depicted in FIG. 4C is the output voltage VOUT of the integrator 120. In addition, the asynchronous count C1 and the time count C2 are shown. The signals are represented as functions of time t. As signal acquisition proceeds for a certain integration time (T_INT), the integration time (T_INT) is shown as a means of reference. As shown in FIG. 4C, three integration periods of C2$n$ are shown to follow the ADC code of 3.

Figure 4D:
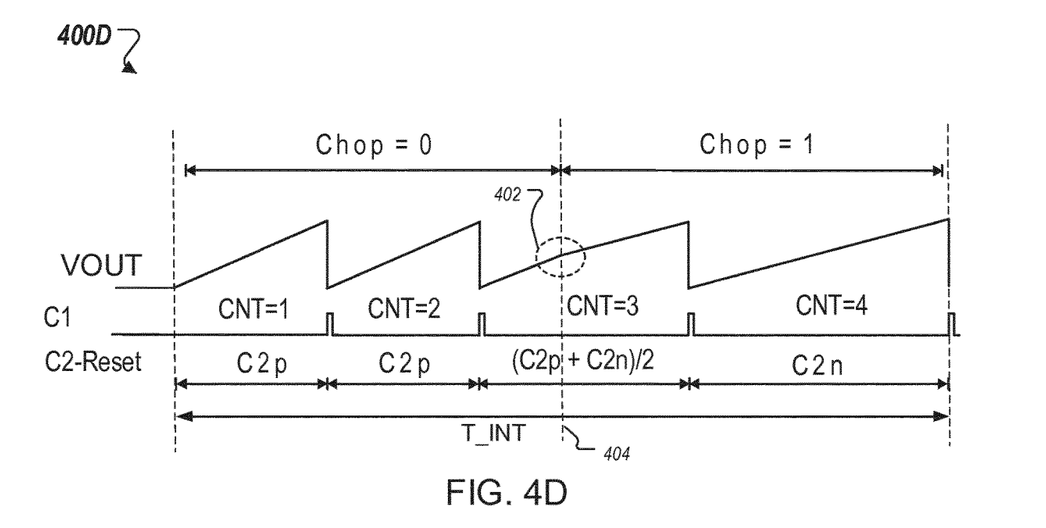

FIG. 4D shows an exemplary timing diagram 400D of signals of the exemplary embodiment of an optical sensor arrangement an ADC code of 4 for the circuit of FIG. 2 operating with the first chopping technique. In particular, the first chopping technique of FIG. 3B is used. The diagram 400D illustrates the different signals and operation of a light-to-frequency converter. Depicted in FIG. 4D is the output voltage VOUT of the integrator 220. In addition, the asynchronous count C1 and the time count C2 are shown. The signals are represented as functions of time t. As signal acquisition proceeds for a certain integration time (T_INT), the integration time (T_INT) is shown as a means of reference. As shown in FIG. 4D, four integration periods are shown to follow the ADC code of 4. The first chopping technique is being implemented in FIG. 4D, where a first phase of chopping (Chop 0) is implemented at the integrator 220 until the halfway point 404, of the integration time (T_INT). The first phase of chopping (Chop 0) is applied at a first polarity, e.g., a +Ve offset across the input terminals of the first amplifier. Then a second phase of chopping (Chop 1) is implemented at the integrator 220 at the halfway point 404 without stopping the integration cycle. The second phase of chopping is applied at a second polarity, which is the opposite of the first polarity, e.g., a −Ve offset across the input terminals of the first amplifier. Because of the change from the first phase of chopping (Chop 0) to the second phase of chopping (Chop 1), there is a small change in the output voltage and slope of the integration based on the leakage current, and the small change in the output voltage may introduce sub-zero dark count (see circle 402). Also because of the implementation of the second phase of chopping at the halfway point 404, the integration periods are different in length of time. The first two integration periods C2$p$, and the last integration period C2$n$ are comparable to the integration periods of FIGS. 4B and 4C, respectively. However, since the chopping occurs during the third integration period, this integration period can be represented as:

$$(C2p+C2n)/2.$$

Figure 4E:
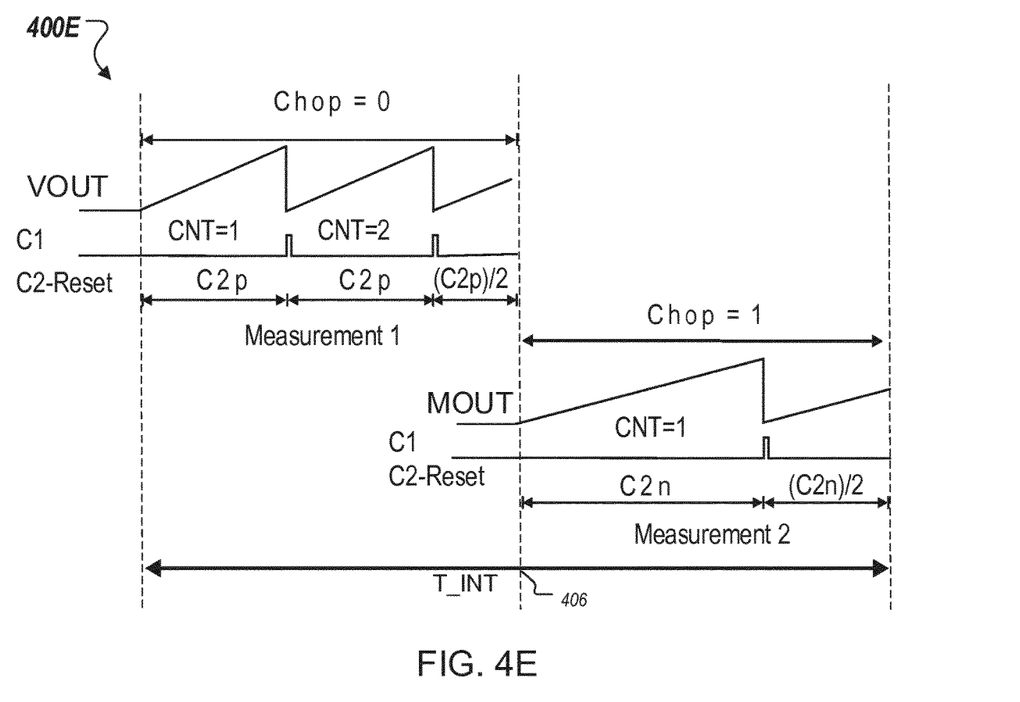

FIG. 4E shows an exemplary timing diagram 400E of signals of the exemplary embodiment of an optical sensor arrangement having an ADC code of 4 for the circuit of FIG. 2 operating in a second chopping technique. In particular, the second chopping technique of FIG. 3C is used. The diagram 400E shows the different signals and operation of a light-to-frequency converter. Depicted in FIG. 4E is the output voltage VOUT of the integrator 220. In addition, the asynchronous count C1 and the time count C2 are shown. The signals are represented as functions of time t. As signal acquisition proceeds for a certain integration time (T_INT), the integration time (T_INT) is shown as a means of reference. As shown in FIG. 4E, four integration periods are shown to follow the ADC code of 4. The second chopping technique is being implemented in FIG. 4E, where a first phase of chopping (e.g., Chop 0) is implemented at the integrator 220 until the halfway point 404, of the integration time (T_INT). Then a reset/initialization phase is implemented, resetting the ADC and signal acquisition is re-initialized at the halfway point 404 causing the system to perform two ambient light sensor measurements: "Measurement 1" and "Measurement 2" as shown in FIG. 4E. The second reset/initialization phase stops the integration cycle and changes a polarity of the integrator output. A second phase of chopping (Chop 1) is then implemented at the integrator 220 during "Measurement 2". Because of the change from the first phase of chopping, to the reset/initialization phase, and then to the second phase of chopping, the output change during switching (e.g., the change in slope for the first chopping technique at the halfway point—circle 402) on the output signal information when there is switching in chopping switches is eliminated. Additionally, because the reset/initialization phase changed the polarity of the integrator output, the second phase of chopping (Chop 1) at the first set of chopping switches and the second set of chopping switches is applied at the same polarity of the first phase of chopping. Moreover, due to the implementation of reset/initialization phase and the two different phases of chopping, the integration periods are different in length of time. The first two integration periods C2$p$ in the first half of the integration time (T_INT), and the first integration period C2$n$ in the second half of the integration time (T_INT) after the reset phase are comparable to the integration periods of FIGS. 4B and 4C, respectively. However, since the reset/initialization phase occurs, the last two periods in each measurement period are cut in half, and can be represented as: C2$p$/2, C2$n$/2, respectively.

According to some implementations, changing the polarity of the integrator output from a first polarity to a second polarity includes switching the output of the first set of chopping switches for the input terminals of the first amplifier, and switching the output of the second set of chopping switches for the input terminals of the second amplifier.

Changing the polarity of the integrator output from a first polarity to a second polarity by switching the inputs from each set of chopping switches for each input terminal for each amplifier, respectively, eliminates the offset voltage across the photodiode.

While this specification contains many specific implementation details, these should not be construed as limitations on the scope of any features or of what may be claimed, but rather as descriptions of features specific to particular embodiments. Certain features that are described in this specification in the context of separate embodiments also can be implemented in combination in a single embodiment. Conversely, various features that are described in the context of a single embodiment also can be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not necessarily be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous. Accordingly, other implementations are within the scope of the following claims.

What is claimed is:

1. A sensor arrangement for light-to-frequency conversion, comprising:
    a photodiode;
    an analog-to-digital converter (ADC) operable to perform a chopping technique in response to a first clock signal (CLK1), and operable to convert a photocurrent (IPD) generated by the photodiode into a digital comparator output signal (LOUT), the ADC comprising:
        a sensor input coupled to the photodiode;
        a result output for providing the digital comparator output signal (LOUT);
        an integrator comprising:
            an integrator input coupled to the sensor input and operable to receive an integrator input signal;
            a first and a second amplifier;
            a first set of chopping switches electrically coupled to input terminals of the first amplifier;
            a second set of chopping switches electrically coupled to an output of the first amplifier and electrically coupled to input terminals of the second amplifier; and
            an integrator output providing an integrator output signal (OPOUT); and
    a signal processing unit coupled to the result output of the ADC and configured to determine, from the digital comparator output signal (LOUT), a digital output signal (ADC-COUNT).

2. The sensor arrangement of claim 1, wherein the ADC is operable to perform, prior to performing the chopping the technique, an initial phase comprising:
    applying a coarse auto zero operation before a start of an integration time (T_INT) for an integration cycle; and
    applying a first reset/initialization phase that resets the ADC and signal acquisition is initialized at the start of the integration time (T_INT) for the integration cycle.

3. The sensor arrangement of claim 2, wherein the ADC is operable to perform, subsequent to performing the initial phase, a first chopping technique comprising:
    applying a first phase of chopping at the first set of chopping switches and the second set of chopping switches, wherein the first phase of chopping is applied at a first polarity; and
    applying, at a halfway timestamp and without stopping the integration cycle, a second phase of chopping at the first set of chopping switches and the second set of chopping switches, the halfway timestamp indicating a halfway point of the integration time (T_INT), wherein the second phase of chopping is applied at a second polarity, wherein the second polarity is opposite of the first polarity.

4. The sensor arrangement of claim 2, wherein the ADC is operable to perform, subsequent to performing the initial phase, a second chopping technique comprising:
    applying, at a halfway timestamp, a first phase of chopping at the first set of chopping switches and the second set of chopping switches, the halfway timestamp indicating a halfway point of an integration time (T_INT) for the integration cycle, wherein the first phase of chopping is applied at a first polarity;
    applying a second reset/initialization phase that resets the ADC and signal acquisition is re-initialized at the halfway point of the integration time (T_INT) for the integration cycle, wherein the second reset/initialization phase stops the integration cycle and changes a polarity of the integrator output; and
    applying, after the second reset/initialization phase, a second phase of chopping at the first set of chopping switches and the second set of chopping switches, wherein the second phase of chopping is applied at the first polarity.

5. The sensor arrangement of claim 4, wherein changing the polarity of the integrator output comprises:
    switching the output of the first set of chopping switches for the input terminals of the first amplifier; and
    switching the output of the second set of chopping switches for the input terminals of the second amplifier.

6. The sensor arrangement of claim 1, wherein the signal processing unit comprises:
    a first counter having a first clock input coupled to the result output and comprising a first reset input;
    a second counter comprising a second clock input and a second reset input; and
    a logic/calculation engine comprising a calculation input coupled to a first counter output of the first counter and a second counter output of the second counter;
    wherein:
        the first counter is operable to receive the first clock signal (CLK1) at the first clock input and to generate the asynchronous count (C1) depending on the first clock signal (CLK1);

the second counter is operable to receive the second clock signal (CLK2) at the second clock input and to generate the time count (C2) depending on the second clock signal (CLK2); and the logic/calculation engine is operable to receive the asynchronous count (C1) and the time count (C2) and to calculate the digital output signal (ADC-COUNT) from the asynchronous count (C1) and the time count (C2).

7. The sensor arrangement of claim 1, further comprising a latched comparator operable receive the integrator output signal (OPOUT) and to provide the digital comparator output signal (LOUT).

8. The sensor arrangement of claim 1, further comprising a digital control circuit operable to control each switch to switch between an open state and a closed state depending on a clock cycle.

9. The sensor arrangement of claim 1, wherein the digital output signal (ADC-COUNT) comprises an asynchronous count (C1) comprising an integer number of counts depending on the first clock signal (CLK1) and a fractional time count (C2) depending on a second clock signal (CLK2).

10. The sensor arrangement of claim 1, wherein the digital output signal (ADC-COUNT) is indicative of the photocurrent generated by the photodiode.

11. The sensor arrangement of claim 1, the signal processing unit is configured to determine, based on the time count, an average integration period indicative of a modulation in the digital comparator output signal (LOUT).

12. A method for light-to-frequency conversion comprising:
generating, by an offset voltage across a photodiode, a photocurrent (IPD);
converting, by an analog-to-digital converter (ADC), and based on a chopping technique performed during an integration cycle, the photocurrent (IPD) into a digital comparator output signal (LOUT) depending on a first clock signal (CLK1), wherein the ADC comprises an integrator that includes:
a first set of chopping switches electrically coupled to input terminals of a first amplifier;
a second set of chopping switches electrically coupled to an output of the first amplifier and electrically coupled to input terminals of a second amplifier; and
an integrator output providing an integrator output signal (OPOUT);
determining, based on the digital comparator output signal (LOUT), an asynchronous count (C1) comprising an integer number of counts depending on the first clock signal (CLK1);
determining, based on the digital comparator output signal (LOUT), a fractional time count (C2) depending on a second clock signal (CLK2); and
calculating, based on the asynchronous count (C1) and the fractional time count (C2), a digital output signal (ADC-COUNT) which is indicative of the photocurrent generated by the photodiode.

13. The method of claim 12, wherein converting the photocurrent based on the chopping technique cancels the offset voltage across the photodiode.

14. The method of claim 12, further comprising, prior to performing the chopping technique, performing an initial phase comprising:
applying a coarse auto zero operation before a start of an integration time (T_INT) for the integration cycle; and
applying a first reset/initialization phase that resets the ADC and signal acquisition is initialized at the start of the integration time (T_INT) for the integration cycle.

15. The method of claim 14, wherein, subsequent to performing the initial phase, the chopping technique comprises a first chopping technique, the first chopping technique comprises:
applying a first phase of chopping at the first set of chopping switches and the second set of chopping switches, wherein the first phase of chopping is applied at a first polarity; and
applying, at a halfway timestamp and without stopping the integration cycle, a second phase of chopping at the first set of chopping switches and the second set of chopping switches, the halfway timestamp indicating a halfway point of the integration time (T_INT), wherein the second phase of chopping is applied at a second polarity, wherein the second polarity is opposite of the first polarity.

16. The method of claim 14, wherein, subsequent to performing the initial phase, the chopping technique comprises a second chopping technique, the second chopping technique comprises:
applying, at a halfway timestamp, a first phase of chopping at the first set of chopping switches and the second set of chopping switches, the halfway timestamp indicating a halfway point of an integration time (T_INT) for the integration cycle, wherein the first phase of chopping is applied at a first polarity;
applying a second reset/initialization phase that resets the ADC and signal acquisition is re-initialized at the halfway point of the integration time (T_INT) for the integration cycle, wherein the second reset/initialization phase stops the integration cycle and changes a polarity of the integrator output; and
applying, after the second reset/initialization phase, a second phase of chopping at the first set of chopping switches and the second set of chopping switches, wherein the second phase of chopping is applied at the first polarity.

17. The method of claim 16, wherein changing the polarity of the integrator output from a first polarity to a second polarity comprises:
switching the output of the first set of chopping switches for the input terminals of the first amplifier; and
switching the output of the second set of chopping switches for the input terminals of the second amplifier.

18. The method of claim 17, wherein changing the polarity of the integrator output from a first polarity to a second polarity by switching the inputs from each set of chopping switches for each input terminal for each amplifier, respectively, eliminates the offset voltage across the photodiode.

* * * * *